US007781243B2

United States Patent
Shin et al.

(10) Patent No.: US 7,781,243 B2
(45) Date of Patent: Aug. 24, 2010

(54) METHOD OF MANUFACTURING DISPLAY SUBSTRATE, METHOD OF PATTERNING INORGANIC LAYER AND METHOD OF MANUFACTURING DISPLAY DEVICE USING THE SAME

(75) Inventors: Yong-Hwan Shin, Yongin-si (KR); Baek-Kyun Jeon, Yongin-si (KR); Soon-Joon Rho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 294 days.

(21) Appl. No.: 11/949,431

(22) Filed: Dec. 3, 2007

(65) Prior Publication Data

US 2008/0188023 A1   Aug. 7, 2008

(30) Foreign Application Priority Data

Feb. 5, 2007   (KR) ...................... 10-2007-0011750

(51) Int. Cl.
*H01L 21/00* (2006.01)
*H01L 21/82* (2006.01)
*C09K 19/00* (2006.01)
*G02F 1/03* (2006.01)

(52) U.S. Cl. ............................ 438/30; 438/129; 430/20; 257/E21.535

(58) Field of Classification Search ................... 438/30, 438/129; 427/282; 430/20; 257/E21.535; 313/500, 504, 503, 509; 349/155, 138, 139, 349/96, 36, 33, 123

See application file for complete search history.

(56) References Cited

U.S. PATENT DOCUMENTS

| 6,057,902 | A  | * | 5/2000 | Angelopoulos et al. | ...... 349/129 |
| 6,815,347 | B2 | * | 11/2004 | Sumi | ........................ 438/669 |
| 2004/0125299 | A1 | * | 7/2004 | Nakamura et al. | .......... 349/139 |
| 2008/0087886 | A1 | * | 4/2008 | Yang | ............................ 257/40 |
| 2008/0129902 | A1 | * | 6/2008 | Qi | ................................ 349/33 |

* cited by examiner

*Primary Examiner*—Walter L Lindsay, Jr.
(74) *Attorney, Agent, or Firm*—F. Chau & Associates, LLC

(57) ABSTRACT

A method of manufacturing a display substrate includes forming a plurality of thin film transistors (TFTs) on a first substrate in a matrix, forming a plurality of pixel electrodes connected to the TFTs, forming a connecting pad to receive a common voltage, forming an organic pattern on the connecting pad, depositing an inorganic alignment layer covering the organic pattern on the first substrate, and removing the organic pattern and the inorganic alignment layer remaining on the organic pattern.

19 Claims, 15 Drawing Sheets

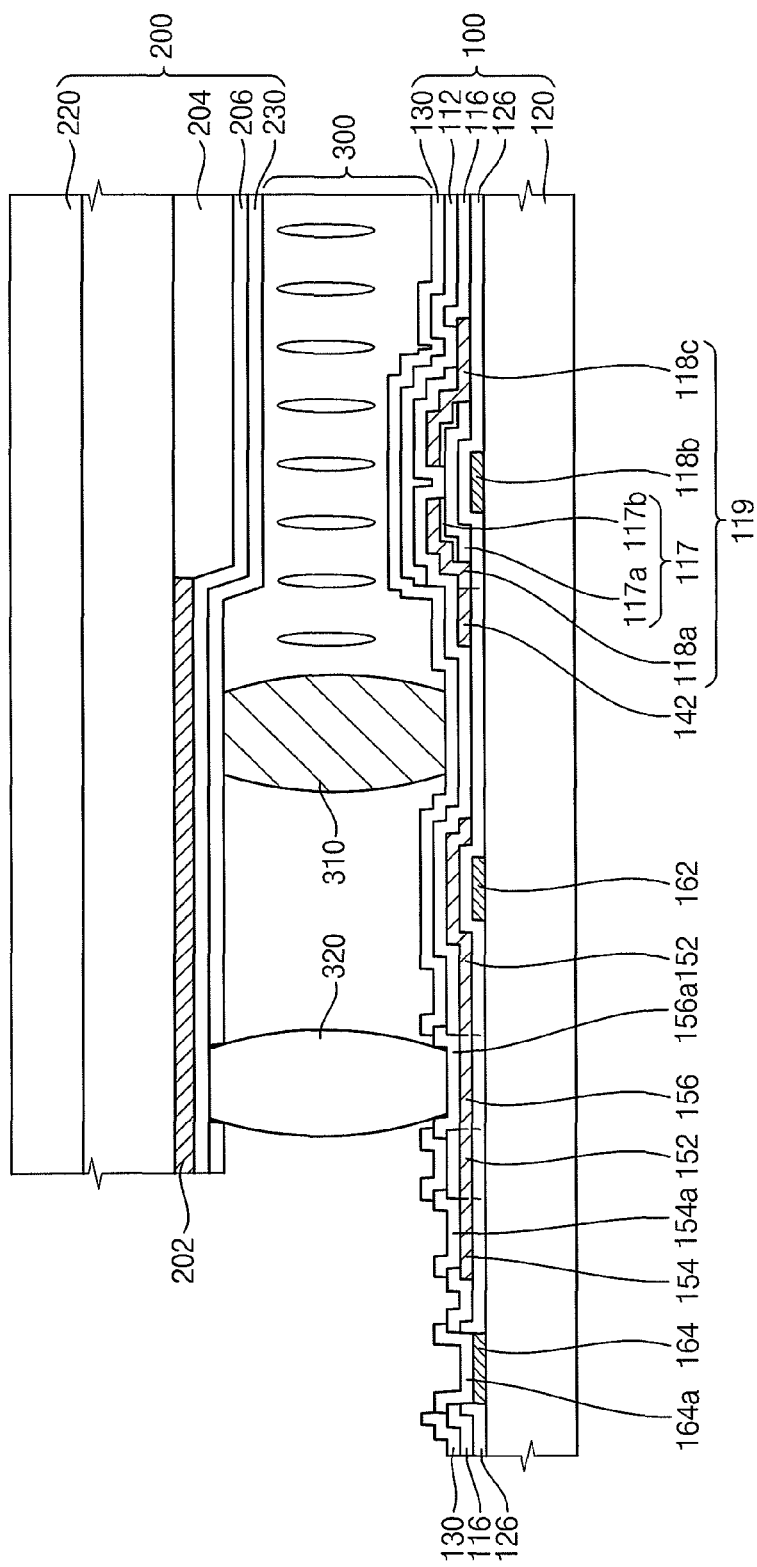

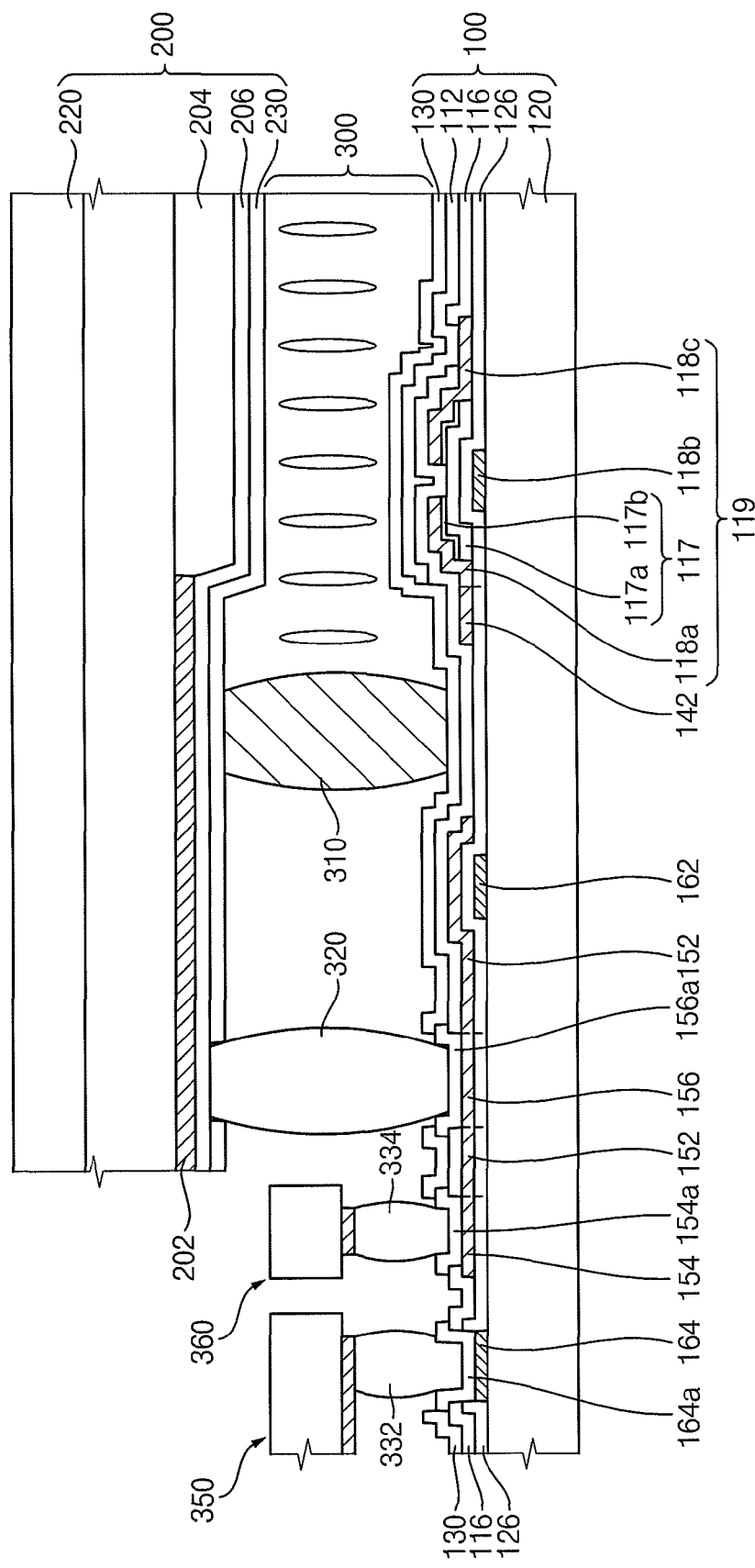

METHOD OF MANUFACTURING DISPLAY SUBSTRATE, METHOD OF PATTERNING INORGANIC LAYER AND METHOD OF MANUFACTURING DISPLAY DEVICE USING THE SAME

CROSS-REFERENCE TO RELATED APPLICATION

The present application claims priority under 35 U.S.C. §119 to Korean Patent Application No. 2007-011750, filed on Feb. 5, 2007, the disclosure of which is incorporated herein by reference in its entirety.

BACKGROUND OF THE INVENTION

1. Technical Field

The present disclosure relates to a method of manufacturing a display substrate, method of patterning an inorganic layer and method of manufacturing a display device using the same, and more particularly, to a method of manufacturing a display substrate capable of simplifying a manufacturing process.

2. Discussion of the Related Art

Flat panel display devices are thinner, lighter and smaller than other types of display devices.

A liquid crystal display (LCD) device, a flat panel display device, includes an array substrate, a countering substrate facing the array substrate and a liquid crystal layer interposed between the array substrate and the countering substrate. Since an arrangement of liquid crystals in the liquid crystal layer can be adjusted by an electric field formed between a pixel electrode of the array substrate and a common electrode of the countering substrate, a light transmittance of the liquid crystal layer is changed, thereby displaying an image.

To supply a common voltage to the common electrode of the countering substrate, the common electrode of the countering substrate and a common voltage pad of the array substrate are exposed by patterning an upper alignment layer of the countering substrate and a lower alignment layer of the array substrate. A conductive spacer is disposed on the exposed common electrode and the common voltage pad so that the common electrode is electrically connected to the common voltage pad.

The alignment layer is patterned by a photolithography process. The photolithography process may include, for example, a deposition process, a developing process and an etching process. However, the photolithography process is an expensive and a time-consuming process.

SUMMARY OF THE INVENTION

Exemplary embodiments of the present invention provide a method of manufacturing a display substrate capable of simplifying a manufacturing process, a method of patterning an inorganic layer and a method of manufacturing a display device using the same.

According to an exemplary embodiment of the present invention, a method of manufacturing a display substrate includes forming a plurality of thin film transistors (TFTs) on a first substrate in a matrix, a plurality of pixel electrodes connected to the TFTs and a connecting pad to receive a common voltage, forming an organic pattern on the connecting pad, depositing an inorganic alignment layer covering the organic pattern on the first substrate, and removing the organic pattern and the inorganic alignment layer remaining on the organic pattern.

The method of manufacturing a display device may further include forming transmission lines to transmit driving signals to the TFTs, forming a plurality of transmission pads disposed at a terminal portion of the transmission lines and forming a common voltage pad electrically connected to the connecting pads.

Forming the organic pattern may include forming a seal coat to cover the connecting pads and the common voltage pad, and forming a short point to cover the connecting pads.

The connecting pads may include a plurality of gate transmission pads and a plurality of data transmission pads, the gate transmission pads include a layer different from a layer of the data transmission layer.

The common voltage pad may include the same or substantially the same layer as a layer of the data transmission pads.

According to an exemplary embodiment of the present invention, a method of patterning an inorganic layer includes forming an organic material to form an organic pattern on a first substrate, depositing an inorganic layer on the first substrate to cover the organic pattern, and removing the inorganic layer remaining on the organic pattern.

The organic pattern may include a photoresist. The organic pattern can be removed using a developing agent.

The organic pattern may include a water-soluble synthetic resin.

The water-soluble synthetic resin may include PVA, polyacryamide, a methylol urea resin, a methylol melamine resin and carboxymethylcellulose CMC.

The organic pattern can be removed using at least one of ultra pure water or deionized water. The organic material is dropped on the first substrate through a nozzle.

The inorganic material may include an alignment layer. The inorganic material may include silicon oxide.

A height of the organic pattern can be higher than a thickness of the inorganic material by more than about 1000 times.

According to an exemplary embodiment of the present invention, a method of manufacturing a display substrate includes forming a common electrode on a second substrate, forming an organic pattern on the common electrode, depositing an inorganic alignment layer on the common electrode covering the organic pattern, and removing the organic pattern and the inorganic alignment layer remaining on the organic pattern.

Removing the organic pattern may include forming a contact hole in the inorganic alignment layer partially exposing the common electrode.

According to an exemplary embodiment of the present invention, a method of manufacturing a display device includes forming a connecting pad on a first substrate to apply a common voltage, forming a lower organic pattern on the connecting pad, depositing a lower alignment layer on the first substrate covering the lower organic pattern, removing the lower organic pattern partially exposing the common electrode, forming a common electrode on a second substrate and an upper alignment layer on the common electrode, the upper alignment layer including a contact hole partially exposing the common electrode, forming a sealant interposed between the lower alignment layer and the upper alignment layer, forming a connecting spacer between the connecting pad and the common electrode electrically connecting the connecting pad and the common electrode through the contact hole, and forming a liquid crystal layer between the lower alignment layer and the upper alignment layer, the liquid crystal layer sealed by the sealant.

Forming the connecting pad may include forming a TFT on a first substrate, a pixel electrode connected to the TFT, forming a transmission line to transmit a driving signal to the TFT, and forming a transmission pad connected to a terminal portion of the transmission line.

BRIEF DESCRIPTION OF THE DRAWINGS

Exemplary embodiments of the present invention can be understood in more detail from the following descriptions taken in conjunction with the accompanying drawings, in which:

FIGS. 13 to 15 are cross-sectional views showing a method of manufacturing a display device according to an exemplary embodiment of the present invention.

DESCRIPTION OF EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein.

Figure 1:
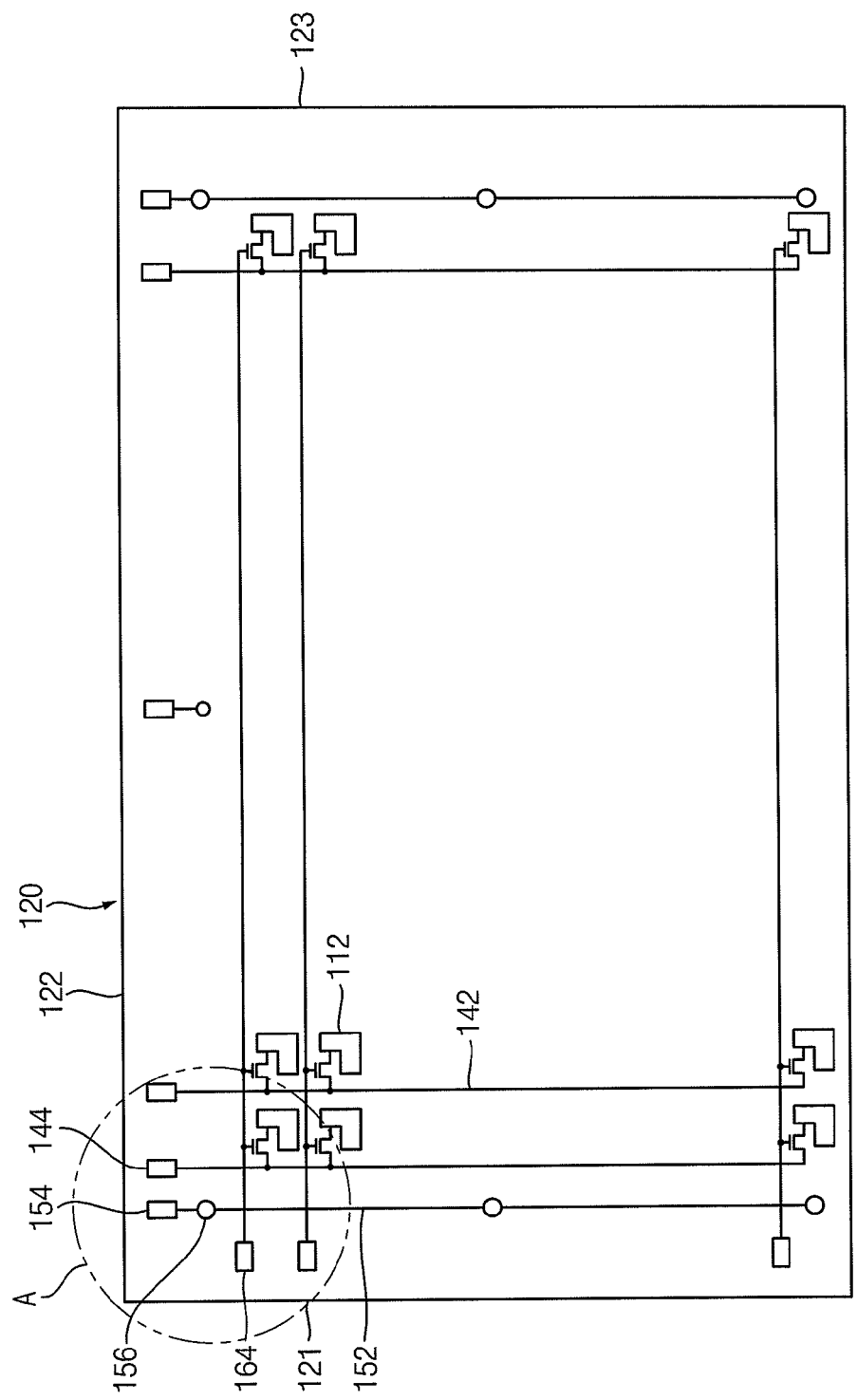
FIG. 1 is a plan view of an array substrate according to an exemplary embodiment of the present invention.
Figure 2:
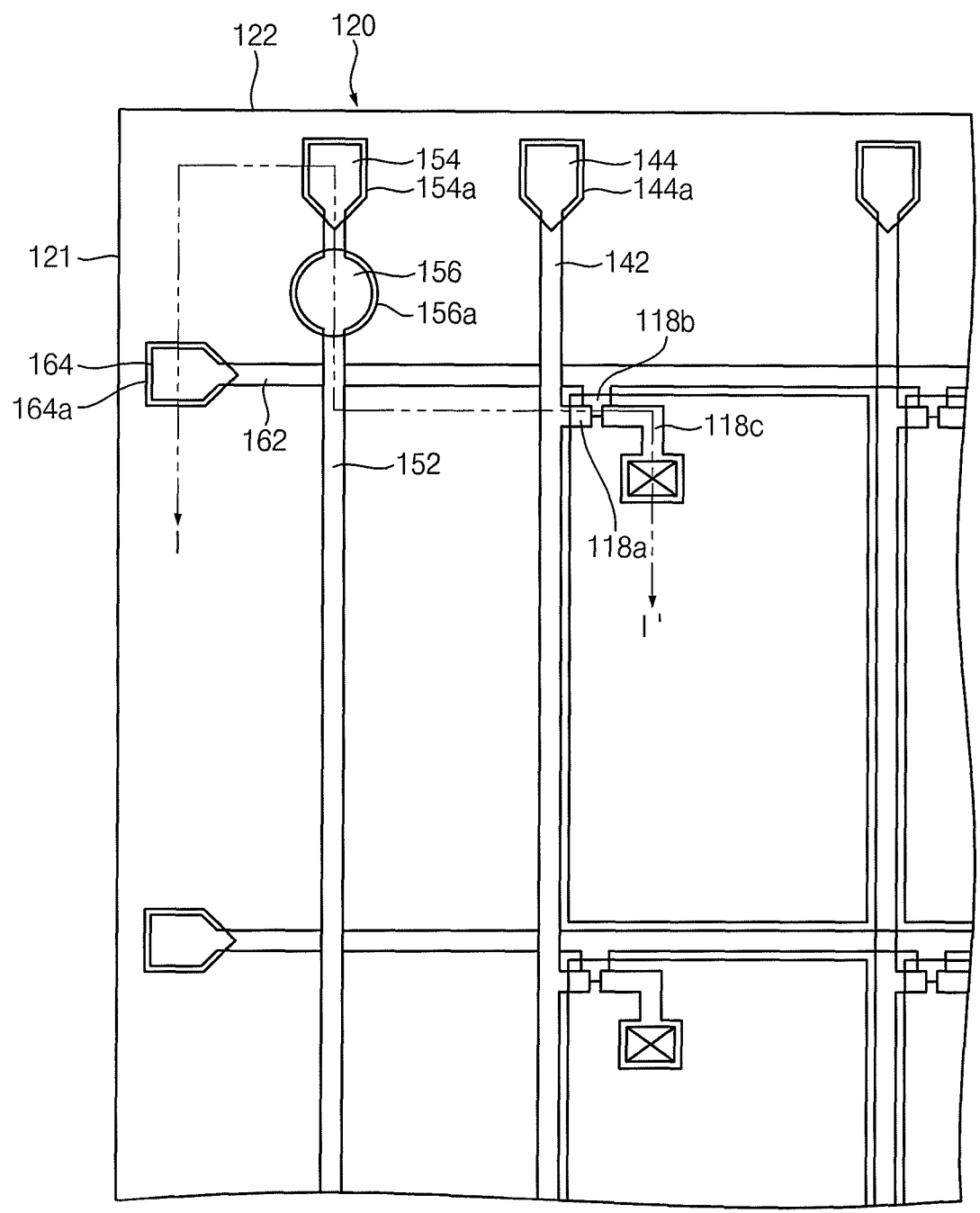
FIG. 2 is an enlarged plan view showing the portion 'A' of FIG. 1.
Figure 3:
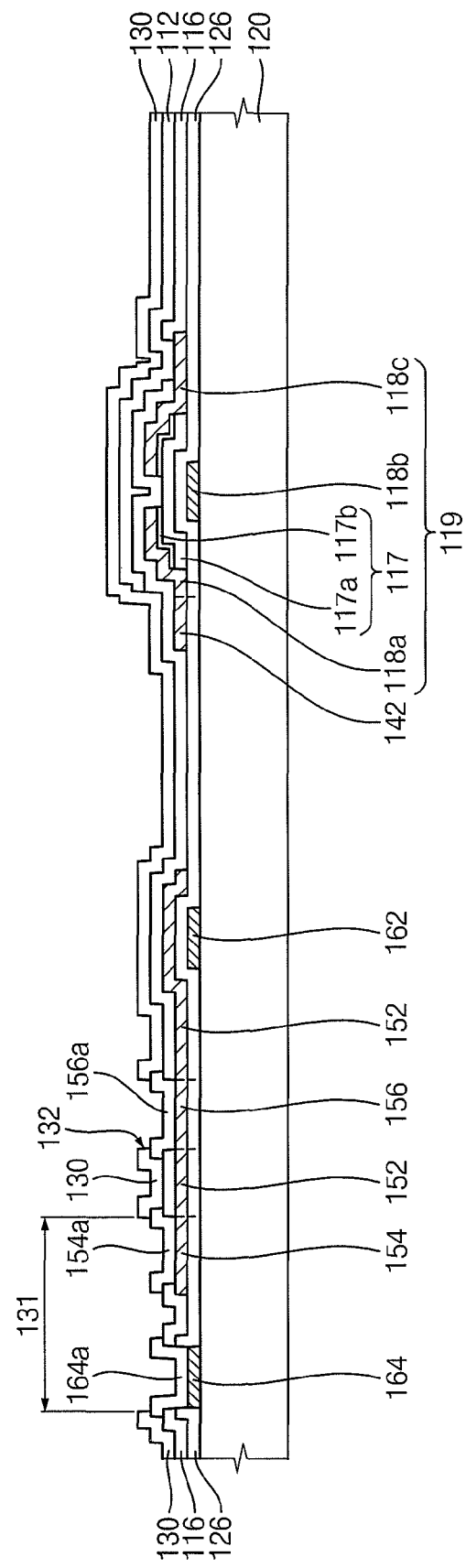
FIG. 3 is a cross-sectional view taken along the line I-I' of FIG. 2.

FIG. 1 is a plan view of an array substrate according to an exemplary embodiment of the present invention. FIG. 2 is an enlarged plan view showing the portion 'A' of FIG. 1. FIG. 3 is a cross-sectional view taken along the line I-I' of FIG. 2.

Referring to FIGS. 1 to 3, an array substrate includes a first substrate 120, a plurality of thin film transistors (TFTs) 119, a plurality of pixel electrodes 112, a gate insulation layer 126, a passivation layer 116, a plurality of gate lines 162, a plurality of gate pads 164, a plurality of data lines 142, a plurality of data pads 144, a lower alignment layer 130, a common voltage line 152, a common voltage pad 154 and a plurality of connecting pads 156.

The first substrate 120 may include, for example, transparent glass to pass light therethrough. The glass may have a non-alkaline characteristic. The first substrate 120 may include a transparent synthetic resin such as, for example, triacetylcellulose TAC, polycarbonate PC, polyethersulfone PES, polyethyleneterephthalate PET, polyethylenenaphthalate PEN, polyvinylalcohol PVA, polymethylmethacrylate PMMA and cyclo-olefin polymer COP.

The gate lines 162 are disposed on the first substrate 120 and are extended substantially parallel with each other.

The gate pads 164 are connected to terminal portions of the gate lines 162. In an exemplary embodiment, the gate pads 164 are disposed adjacent a first side portion 121 of the first substrate 120.

The array substrate may further include a plurality of storage capacitor lines (not shown) disposed between adjacent the gate lines 162 on the first substrate 120. The storage capacitor lines overlap the pixel electrodes 112 so that storage capacitors are formed.

The gate insulation layer 126 is formed on the first substrate 120 to cover the gate lines 162 and a plurality of gate electrodes 118b of the TFTs 119. The gate electrodes 118b are electrically connected to the gate lines 162. In an exemplary embodiment, the gate insulation layer 126 includes a plurality of holes to expose the gate pads 164.

A semiconductor pattern 117 of each of the TFTs 119 includes an amorphous silicon layer 117a and an N+ amorphous silicon layer 117b formed on the amorphous silicon layer 117a.

The amorphous silicon layer 117a is formed on the gate insulation layer 126, and corresponds to the gate electrode 118b.

The N+ amorphous silicon layer 117b includes two patterns spaced apart from each other on the amorphous silicon layer 117a.

The TFT 119 includes the gate electrode 118b, the semiconductor pattern 117, a source electrode 118a and a drain electrode 118c. When voltages are applied to the gate electrode 118b and the source electrode 118a, a channel is formed in the semiconductor pattern 117 to electrically connect the source electrode 118a and the drain electrode 118c.

The source electrode 118a is formed on the semiconductor pattern 117, and is electrically connected to the data lines 142.

The data lines 142 are formed on the gate insulation layer 126, and are extended substantially parallel with each other. An extending direction of the data lines 142 crosses an extending direction of the gate lines 162.

The data pads 144 are connected to terminal portions of the data lines 142. In an exemplary embodiment, the data pads 144 are disposed adjacent a second side portion 122 of the first substrate 120.

The drain electrode 118c is formed on the semiconductor pattern 117, and spaced apart from the source electrode 118a.

In an exemplary embodiment, the common voltage lines 152 are disposed at the first side portion 121 and are disposed adjacent a third side portion 123.

The common voltage pads 154 are connected to terminal portions of the common voltage lines 152. In an exemplary embodiment, the common voltage pads 154 are disposed adjacent the second side portion 122.

The connecting pads 156 are disposed on the common voltage lines 152, and are formed from the same or substantially the same layer as the common voltage lines 152. In an exemplary embodiment, the connecting pads 156 are disposed adjacent corner portions and/or a central line of the array substrate.

In an exemplary embodiment, the common voltage pads 154 and the connecting pads 156 are formed from the same or substantially the same layer as the data pads 144. The common voltage pads 154 and the connecting pads 156 may be formed from the same or substantially the same layer as the gate pads 164.

The passivation layer 116 is formed on the gate insulation layer 126 to cover the storage capacitor lines, the data lines 142, the TFTs 119 and the common voltage lines 152.

The passivation layer 116 includes a plurality of holes exposing the drain electrode 118c, the gate pads 164, the data pads 144, the common voltage pads 154 and the connecting pads 156.

The pixel electrodes 112 are formed on the passivation layer 116, and are electrically connected to the drain electrode 118c. In an exemplary embodiment, the pixel electrodes 112 may include a transparent conductive material. The transparent conductive material may include, for example, indium tin oxide (ITO), amorphous ITO and indium zinc oxide (IZO).

In an exemplary embodiment, a plurality of gate covering materials 164a, a plurality of data covering materials 144a, a plurality of common voltage covering materials 154a and a plurality of connecting covering materials 156a may be formed on the gate pads 164, the data pads 144, the common voltage pads 154 and the connecting pads 156.

The gate covering materials 164a, the data covering materials 144a, the common voltage covering materials 154a and the connecting covering materials 156a may be formed from the same or substantially the same layer as the pixel electrodes 112.

The gate covering materials 164a, the data covering materials 144a, the common voltage covering materials 154a and the connecting covering materials 156a cover exposed portions of the gate pads 164, the data pads 144, the common voltage pads 154 and the connecting pads 156, respectively. Thus, the gate pads 164, the data pads 144, the common voltage pads 154 and the connecting pads 156 can be connected to other components.

The lower alignment layer 130 is formed on the passivation layer 116 to cover the pixel electrodes 112. The lower alignment layer 130 includes a plurality holes exposing the gate pads 164, the data pads 144, the common voltage pads 154 and the connecting pads 156. In an exemplary embodiment, the lower alignment layer 130 includes a contact groove 131 and a plurality of connecting contact holes 132. The contact groove 131 exposes the gate pads 164, the data pads 144, and the common voltage pads 154. The connecting contact holes 132 expose the connecting pads 156. For example, the contact groove 131 may have an 'L' shape parallel with the first side portion 121 and the second side portion 122. The connecting contact holes 132 may have, for example, a circular shape.

The lower alignment layer 130 may include, for example, an inorganic insulation material. In an exemplary embodiment, the lower alignment layer 130 may have a planar shape. The inorganic insulation material of the lower alignment layer 130 may include, for example, silicon oxide. Liquid crystal molecules (not shown) are arranged perpendicular to the alignment layer 130 by an attractive force between the liquid crystal molecules on a surface of the lower alignment layer 130. The attractive force between the liquid crystal molecules includes van der waal's force.

FIGS. 4, 6, 7 and 8 are cross-sectional views showing a method of manufacturing an array substrate according to an exemplary embodiment of the present invention.

Figure 4:
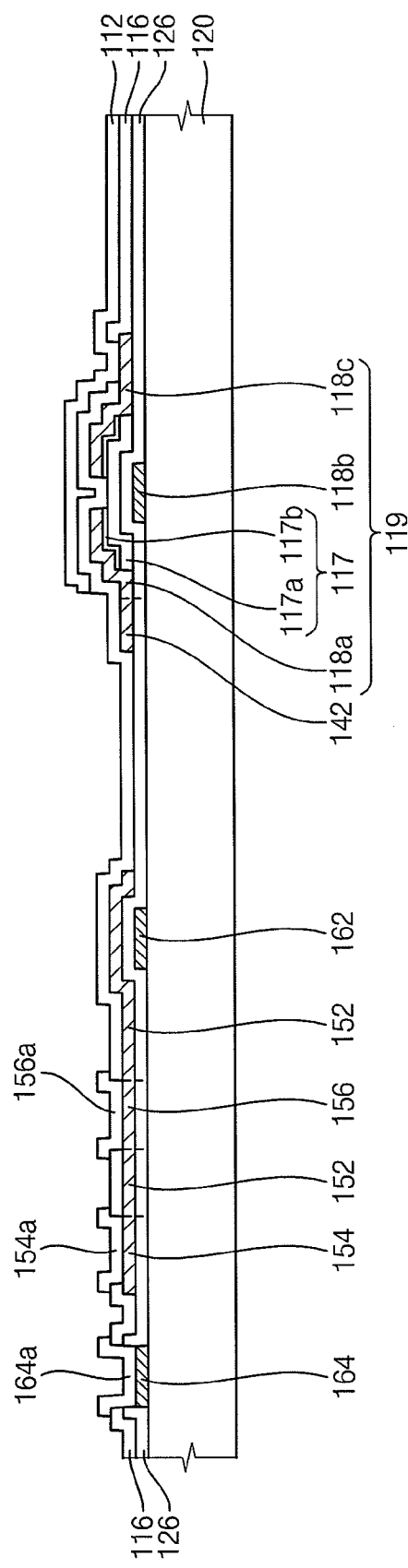
FIGS. 4, 6, 7 and 8 are cross-sectional views showing a method of manufacturing an array substrate according to an exemplary embodiment of the present invention.

Referring to FIGS. 2 and 4, a gate metal layer (not shown) is formed on the first substrate 120. The gate electrode 118b, the gate lines 162 and the gate pads 164 are formed by patterning the gate metal layer.

The gate insulation layer 126 is formed on the first substrate 120. The gate pads 164 are exposed by partially patterning the gate insulation layer 126.

The semiconductor pattern 117 including the amorphous silicon layer 117a and the N+ amorphous silicon layer 117b is formed on the gate insulation layer 126 and corresponds to the gate electrode 118b.

A data metal layer (not shown) is formed on the gate insulation layer 126. The source electrode 118a, the drain electrode 118c, the data lines 142, the data pads 144, the common voltage lines 152, the common voltage pads 154 and the connecting pads 156 are formed by patterning the data metal layer. In an exemplary embodiment, the N+ amorphous silicon positioned between the source electrode 118a and the drain electrode 118c may be partially etched.

The passivation layer 116 is formed on the gate insulation layer 126 to cover the semiconductor pattern 117, the source electrode 118a, the drain electrode 118c, the data lines 142, the data pads 144, the common voltage lines 152, the common voltage pads 154 and the connecting pads 156. The contact holes are formed by partially patterning the passivation layer 116 to expose the gate pads 162, the data pads 144, the common voltage pads 154 and the connecting pads 156.

A transparent conductive layer (not shown) is formed on the passivation layer 116 where the contact holes are formed. The pixel electrodes 112, the gate covering materials 164a, the data covering materials 144a, the common voltage covering materials 154a and the connecting covering materials 156a are formed by patterning the transparent conductive layer.

Figure 5:
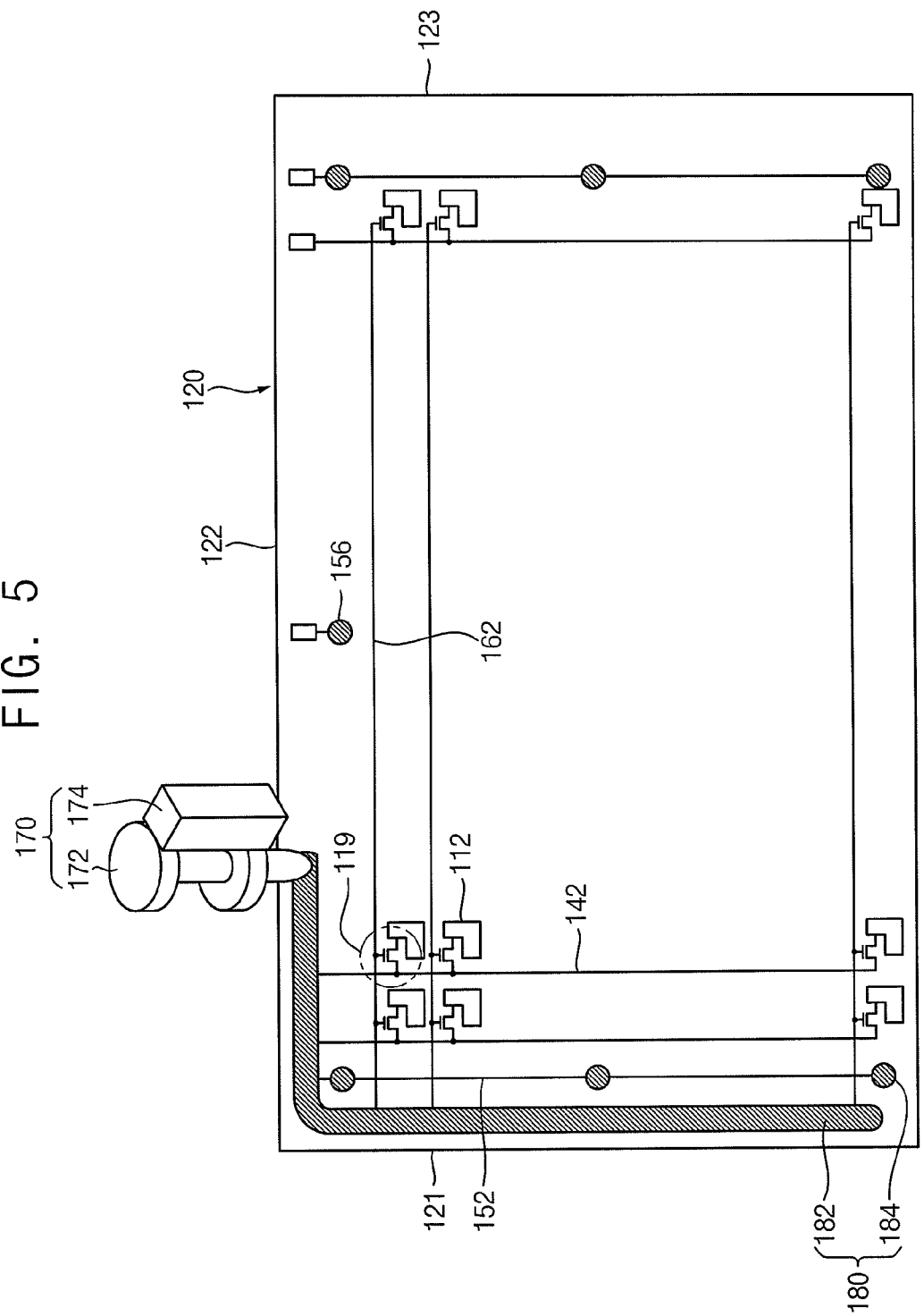
FIG. 5 is a plan view showing forming a seal coat and a short point according to an exemplary embodiment of the present invention.

FIG. 5 is a plan view showing forming a seal coat and a short point according to an exemplary embodiment of the present invention.

Figure 6:
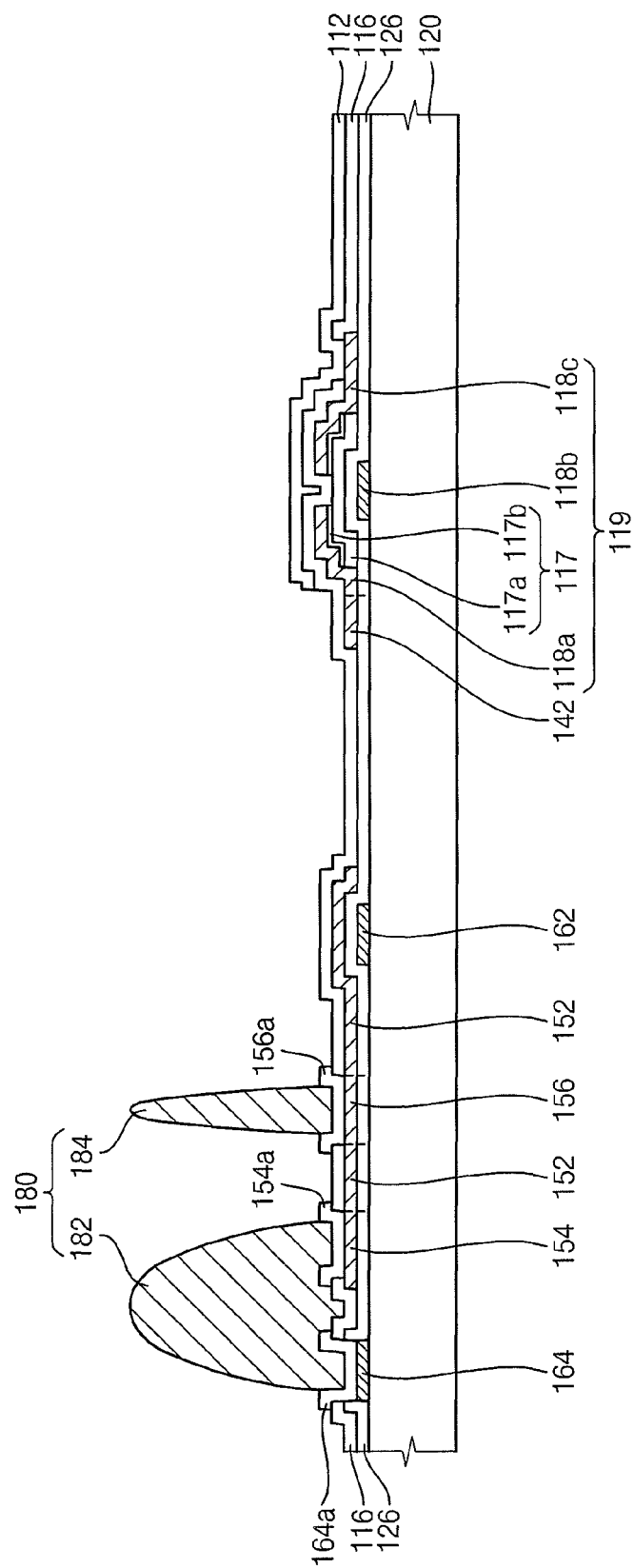

Referring to FIGS. 5 and 6, an organic pattern 180 is formed on the first substrate 120 where the pixel electrodes 112, the gate covering materials 164a, the data covering materials 144a, the common voltage covering materials 154a and the connecting covering materials 156a are formed. In an exemplary embodiment, the organic pattern 180 is dropped through a dropping device 170. The organic pattern 180 includes a seal coat 182 and a short point 184.

The organic pattern 180 includes, for example, an organic material. Since the organic material has fluidity which may vary according to change of a physical condition or a chemical condition of the organic material, the organic material can be removed from the first substrate 120. The organic material may include, for example, photoresist or a water-soluble synthetic resin.

In an exemplary embodiment, the photo-resist may include, for example, novolak or diazo naphto quinine. The novolak functions as a binder. When light is incident to the diazo naphto quinine, nitrogen is separated from the diazo naphto quinine so that ketene is generated. The ketene absorbs water in the novolak to be a soluble material which is resolved by water or alkali.

When the organic material includes the water-soluble synthetic resin, the water-soluble synthetic resin may include, for example, PVA, polyacryamide, a methylol urea resin, a methylol melamine resin or carboxymethylcellulose CMC.

The dropping device 170 includes a nozzle part 172. The nozzle part 172 forms the seal coat 182 by ejecting the water-soluble synthetic resin along with the first side portion 121 and the second side portion 122. The seal coat 182 overlaps the gate covering materials 164a, the data covering materials 144a and the common voltage covering materials 154a.

The nozzle part 172 forms the short points 184 by dropping the organic material on the connecting covering materials 156a. The short points 184 cover the connecting covering materials 156a.

In an exemplary embodiment, the organic pattern 180 can be prevented from spreading on the first substrate 120 by adjusting viscosity of the organic material.

The dropping device 170 may further include a distance measuring part 174. The distance measuring part 174 is disposed adjacent the nozzle part 172, and controls the distance between the nozzle part 172 and the first substrate 120.

Figure 7:
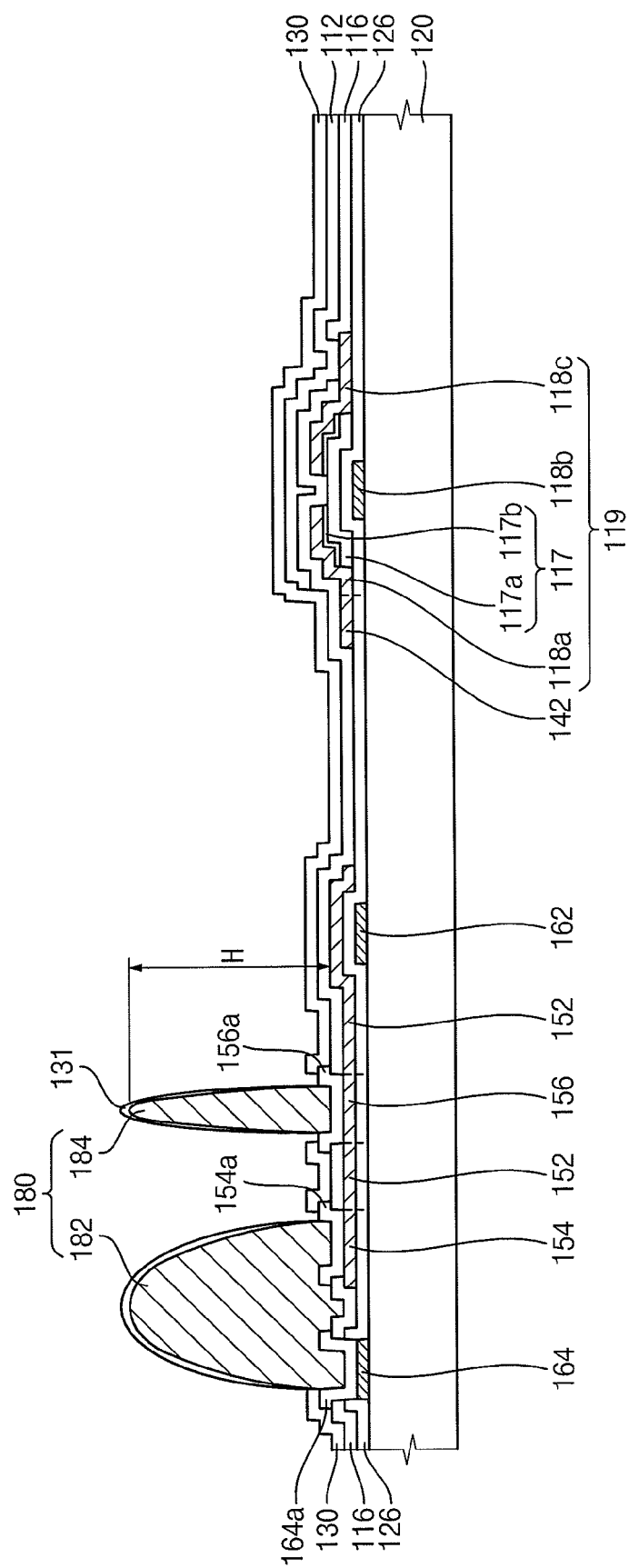

Referring to FIG. 7, the lower alignment layer 130 is deposited on the first substrate 120 where the organic pattern 180 is formed.

In an exemplary embodiment, the first substrate 120 where the organic pattern 180 is formed may be in a chamber (not shown) to deposit the lower alignment layer 130. An electric field is applied to the chamber after silane gas and oxygen gas are injected. A voltage is applied to the first substrate 120. Then, silicon oxide is deposited on the first substrate 120.

Since the silicon oxide does not have a good depositing characteristic with respect to the organic material, a remaining pattern 131 deposited on the organic pattern 180 may have a thickness thinner than that of the lower alignment layer 130 deposited on the pixel electrode 112 and the passivation layer 116. For example, the silicon oxide may not be deposited on a lower portion of a side surface of the organic pattern 180.

A thickness H of the organic pattern 180 is thicker than a thickness t of the lower alignment layer 130. When the thickness H of the organic pattern 180 is smaller than the thickness t of the lower alignment layer 130, the silicon oxide can cover the side surface of the organic pattern 180. In an exemplary embodiment, since the thickness H of the organic pattern 180 is larger than the thickness t of the lower alignment layer 130 by more than about 100 times, the lower portion of the side surface of the organic pattern 180 is exposed. For example, the thickness H of the organic pattern 180 is from about 100 μm to about 300 μm, and the thickness t of the lower alignment layer 130 may be no more than about 1000 Å.

Figure 8:
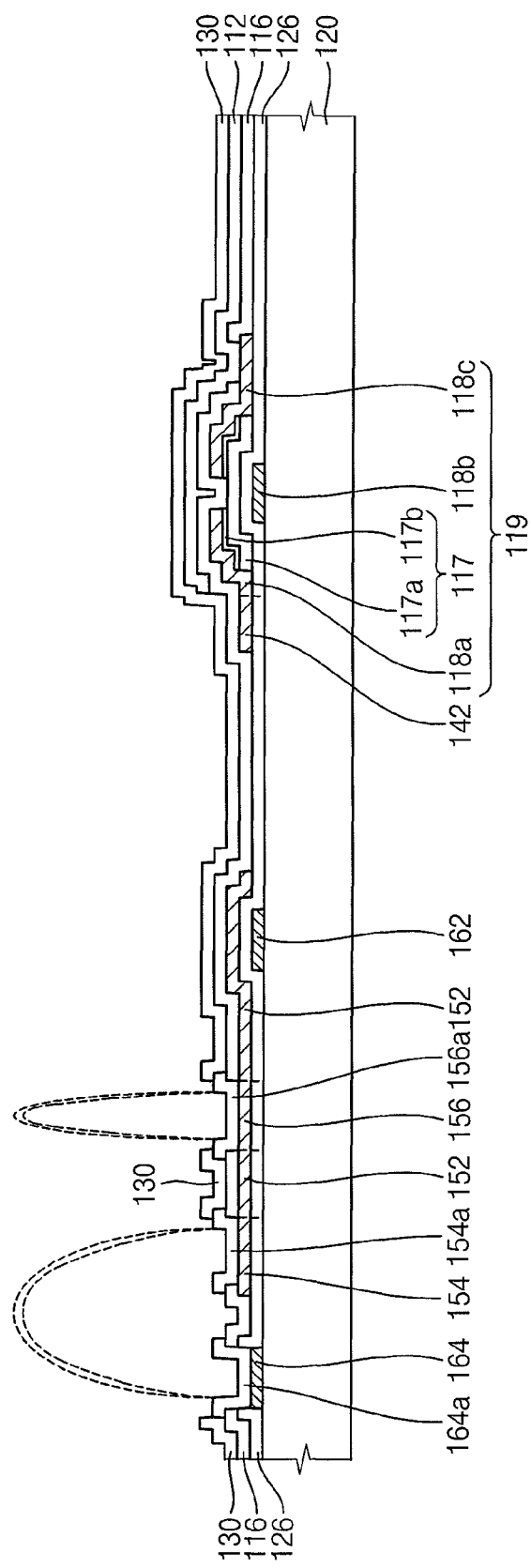

Referring to FIG. 8, the organic pattern 180 is removed from the first substrate using a lift off process and by using a developing agent, wherein the remaining pattern 131 disposed on the organic pattern 180 is lifted off. For example, the developing agent may include, for example, tetramethylammonium hydroxide and/or sodium hydroxide. The remaining pattern 131 disposed on the organic pattern 180 may be simultaneously removed with the organic pattern 180.

When the organic pattern 180 includes the water-soluble synthetic resin, the organic pattern 180 may be removed by using ultra pure water or deionized water.

A plasma treatment may be performed on the organic pattern 180 or the remaining pattern 131.

According to an exemplary embodiment of the present invention, a photolithography process for patterning the lower alignment layer 130 may be omitted and the lower alignment layer 130 can be patterned without an additional mask. Thus, a method of manufacturing the array substrate can be simplified and manufacturing time and cost can be reduced.

According to an exemplary embodiment of the present invention, the substrate where the organic pattern is formed may be heated at a temperature which is lower than a glass transition temperature of the organic material. For example, when the organic pattern may include, for example, a solvent which is evaporated at a temperature of about 200° C., the organic pattern may be heated at a temperature of about 150° C.

When the organic pattern is heated, the volume of the organic pattern is increased so that cracks may occur in the remaining pattern disposed on the organic pattern such that the developing agent can permeate into the organic pattern.

FIGS. 9 to 12 are cross-sectional views showing a method of manufacturing a countering substrate according to an exemplary embodiment of the present invention.

Figure 9:
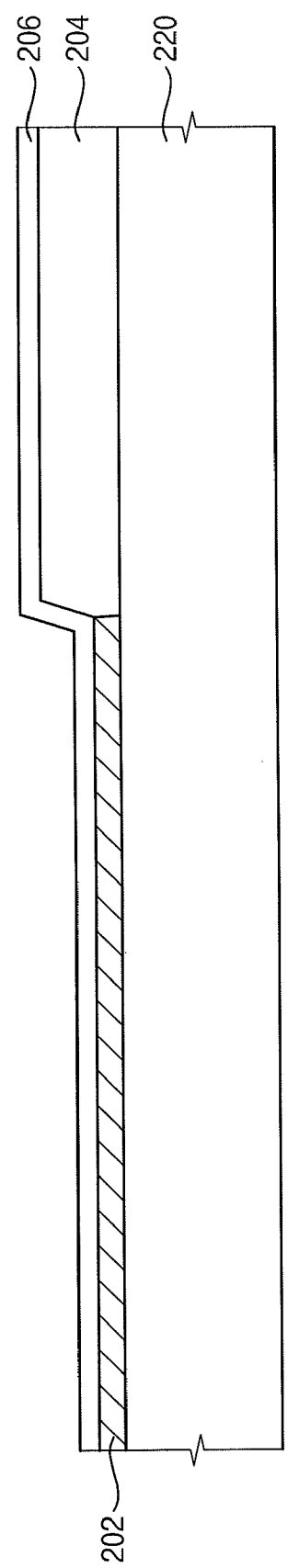
FIGS. 9 to 12 are cross-sectional views showing a method of manufacturing a second substrate according to an exemplary embodiment of the present invention.

Referring to FIG. 9, a black matrix 202 is formed on a second substrate 220. The black matrix 202 blocks light incident to an area where an arrangement of liquid crystals can not be adjusted so that a contrast ratio of a display device can be enhanced.

A color filter 204 is formed on the second substrate 220 where the black matrix 202 is formed. The color filter 204 passes through light having a constant wavelength so that a color image can be displayed.

A common electrode 206 is formed on the second substrate 220 where the black matrix 202 and the color filter 204 are formed. The common electrode 206 may include, for example, a transparent conductive material. The transparent conductive material may include, for example, ITO, amorphous ITO or IZO.

Figure 10:
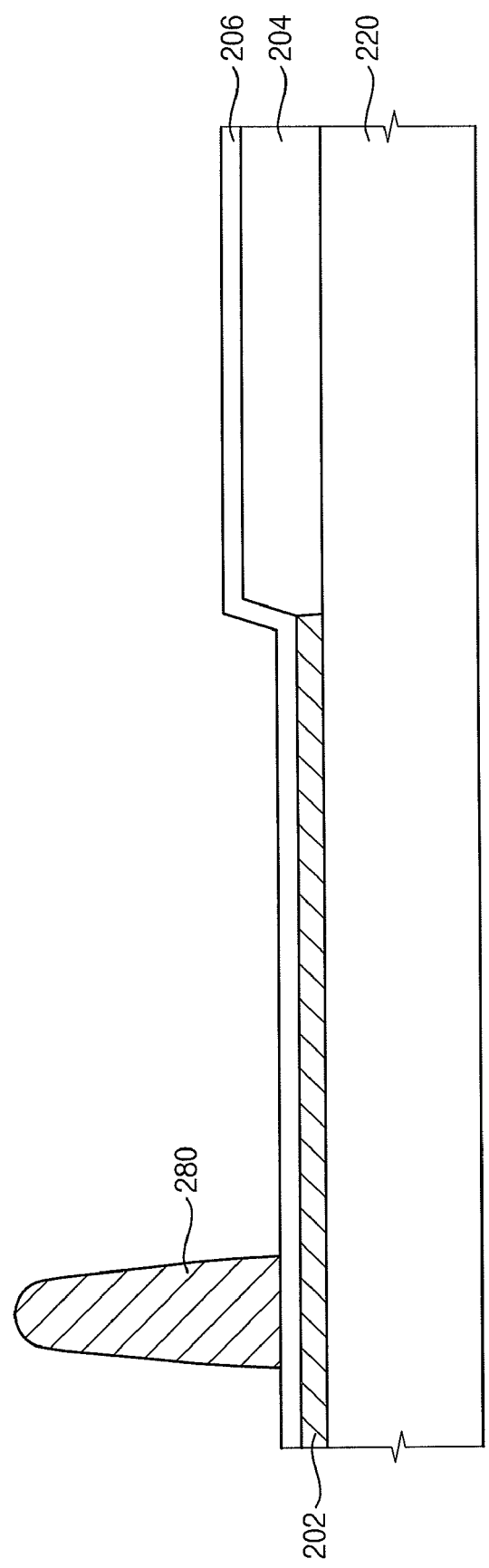

Referring to FIG. 10, an organic pattern 280 is formed on the common electrode 206. In an exemplary embodiment, the organic material 280 can be formed by using a dropping device. The organic material may correspond to the connecting patterns of the array substrate.

The organic pattern 280 may include, for example, a photoresist or a water-soluble synthetic resin.

Figure 11:
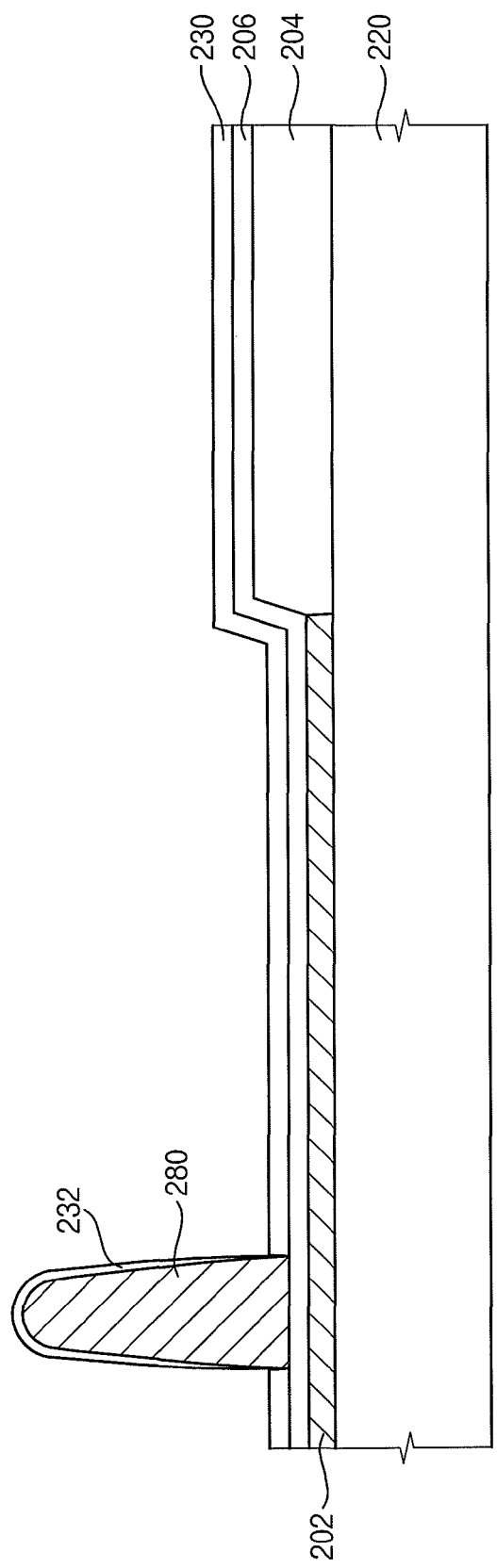

Referring to FIG. 11, an upper alignment layer 230 is formed on the second substrate 220 where the organic pattern 280 is formed. In an exemplary embodiment, the upper alignment layer 230 may include, for example, silicon oxide.

Since the silicon oxide does not have a good depositing characteristic with respect to the organic material, a remaining pattern 232 deposited on the organic pattern 280 may have a thickness thinner than that of the upper alignment layer 230 deposited on the common electrode 206. For example, the silicon oxide may not be deposited on a lower portion of a side surface of the organic pattern 280.

Figure 12:
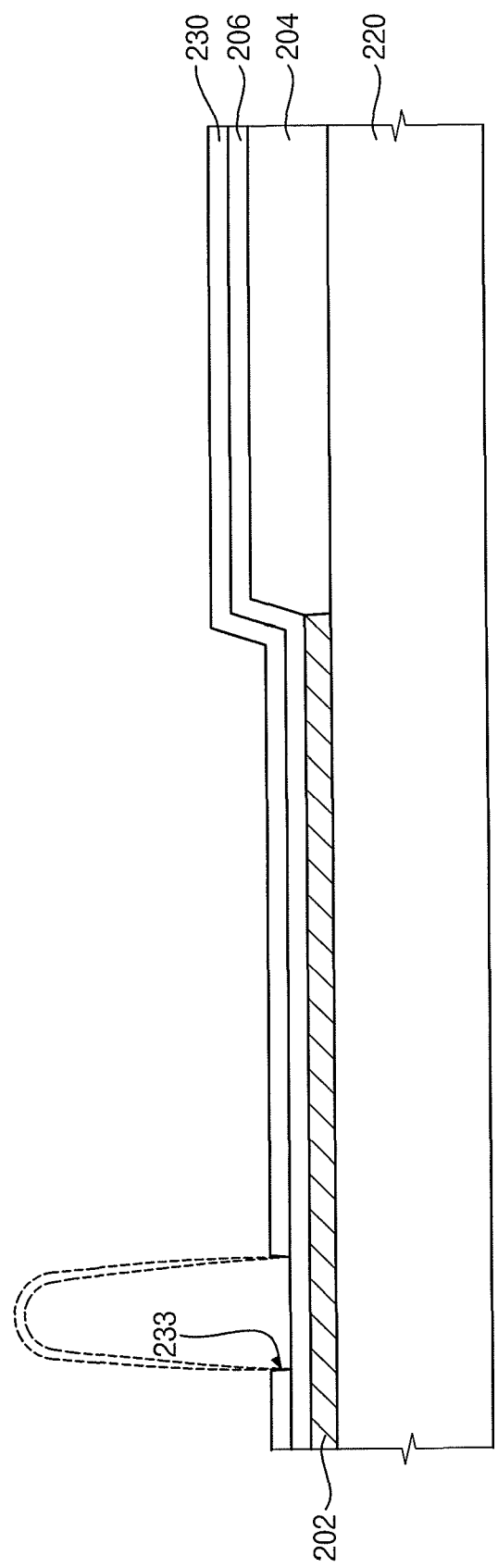

Referring to FIG. 12, the organic pattern 280 including the photo-resist is removed by using a developing agent. The organic pattern 280 is removed, and then the remaining pattern 232 is removed from the second substrate 220 using the lift off process. The remaining pattern 232 disposed on the organic pattern 280 may be simultaneously removed with the organic pattern 280.

When the organic pattern 280 includes the water-soluble synthetic resin, the organic pattern 280 may be removed by using ultra pure water or deionized water. A contact hole 233 is formed in the upper alignment layer 230 to partially expose the common electrode 206.

According to an exemplary embodiment of the present invention, a photolithography process for patterning the upper alignment layer 230 may be omitted by patterning the upper alignment layer 230 without an additional mask. Thus, a method of manufacturing the array substrate can be simplified and manufacturing time and cost can be reduced.

Figure 13:
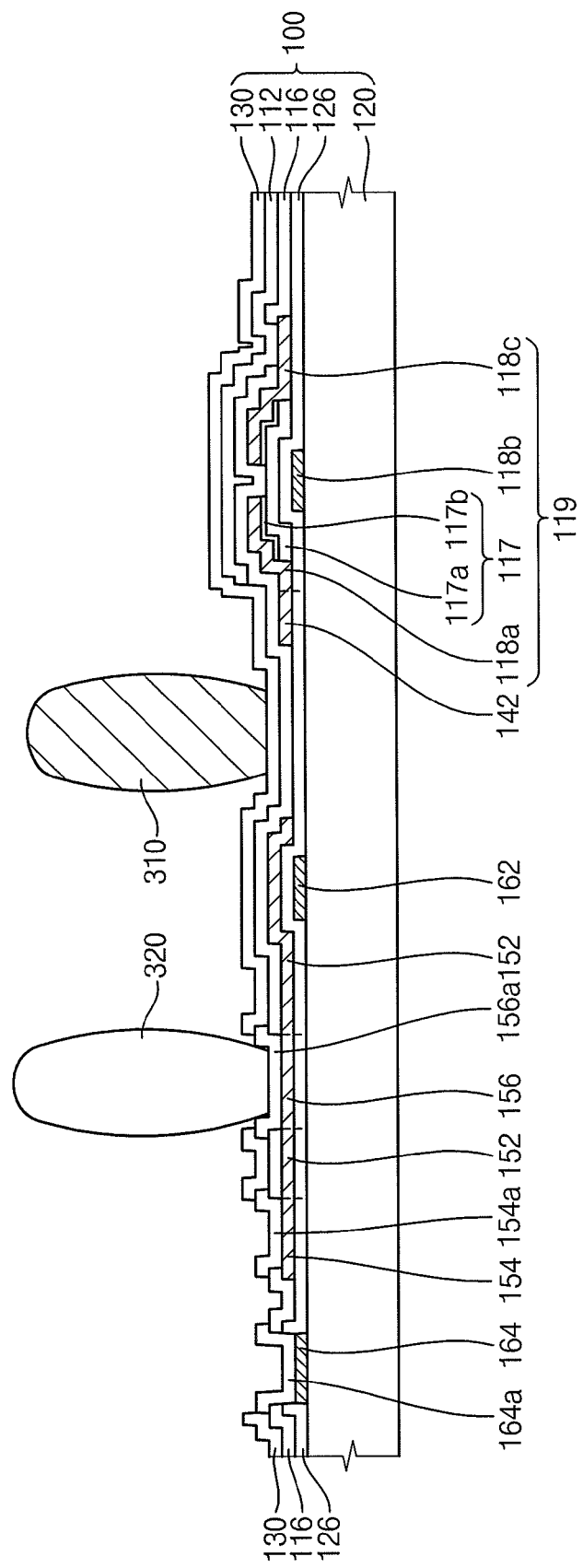

FIGS. 13 to 15 are cross-sectional views showing a method of manufacturing a display device according to an exemplary embodiment of the present invention. In an exemplary embodiment, a method of manufacturing a display device shown in FIGS. 13 to 15 is substantially similar to the exemplary embodiment described in connection with FIGS. 4 to 8. A method of manufacturing a countering substrate is substantially similar to the exemplary embodiment described in connection with FIGS. 9 to 12.

Referring to FIG. 13, a connecting spacer 320 and a sealant 310 are formed on the array substrate 100. The array substrate 100 may include, for example, a plurality of connecting spacers 320.

The connecting spacer 320 is disposed on the connecting pad 156 of the array substrate 100, and is electrically connected to the connecting pad 156 through the connecting covering material 156a.

The sealant 310 is formed to surround a display area of the array substrate 100.

Referring to FIG. 14, liquid crystals are disposed in the display area.

The countering substrate 200 is coupled with the array substrate 100, thereby forming a liquid crystal layer 300.

The common electrode 206 of the countering substrate 200 is electrically connected to the connecting pads 156 through the connecting spacers 320 and the connecting covering materials 156a.

Referring to FIG. 15, a gate anisotropic film 332 and a data anisotropic film 334 are disposed on the gate pads 164 and the data pads 154 of the array substrate 100, respectively. A gate flexible circuit board 350 and a data flexible circuit board 360 are disposed on the gate anisotropic film 332 and the data anisotropic film 334, respectively.

A photolithography process for patterning an upper alignment layer and a lower alignment layer may be omitted by patterning the upper alignment layer and the lower alignment layer without an additional mask. Thus, a method of manufacturing the array substrate can be simplified and manufacturing time and cost can be reduced.

The organic pattern is heated to form cracks on a remaining pattern so that the organic pattern and the remaining pattern can be easily removed.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of manufacturing a display substrate, the method comprising:
    forming a plurality of thin film transistors (TFTs) on a first substrate in a matrix;
    forming a plurality of pixel electrodes connected to the TFTs, and a connecting pad to receive a common voltage;
    forming an organic pattern on the connecting pad;
    depositing an inorganic alignment layer covering the organic pattern on the first substrate; and
    removing the organic pattern to remove the inorganic alignment layer that is remaining on the organic pattern.

2. The method of claim 1, further comprising:
    forming transmission lines to transmit driving signals to the TFTs, a plurality of transmission pads disposed at a terminal portion of the transmission lines, and a common voltage pad electrically connected to the connecting pads.

3. The method of claim 1, wherein forming the organic pattern comprises:
    forming a seal coat to cover the connecting pads and the common voltage pad; and
    forming a short point to cover the connecting pads.

4. The method of claim 2, wherein the connecting pads comprise a plurality of gate transmission pads and a plurality of data transmission pads, and wherein the gate transmission pads comprise a layer different from a layer of the data transmission layer.

5. The method of claim 4, wherein the common voltage pad comprises the same as or substantially the same layer as a layer of the data transmission pads.

6. The method of claim 5, further comprising:
    forming a common electrode on a second substrate;
    forming an organic pattern on the common electrode;
    depositing an inorganic alignment layer on the common electrode covering the organic pattern; and
    removing the organic pattern and the organic alignment layer remaining on the organic pattern.

7. The method of claim 6, wherein removing the organic pattern comprises forming a contact hole in the inorganic alignment layer to partially expose the common electrode.

8. A method of patterning an inorganic layer, the method comprising:
    forming an organic material to form an organic pattern on a first substrate;
    depositing an inorganic layer on the first substrate to cover the organic pattern; and
    lifting off the inorganic layer that is remaining on the organic pattern by removing the organic pattern.

9. The method of claim 8, wherein the organic pattern comprises a photoresist.

10. The method of claim 9, wherein the organic pattern is removed using a developing agent.

11. The method of claim 8, wherein the organic pattern comprises a water-soluble synthetic resin.

12. The method of claim 11, wherein the water-soluble synthetic resin comprises PVA, polyacryamide, a methylol urea resin, a methylol melamine resin, and carboxymethyl-cellulose CMC.

13. The method of claim 12, wherein the organic pattern is removed using at least one of ultra pure water or deionized water.

14. The method of claim 8, wherein the organic material is dropped on the first substrate through a nozzle.

15. The method of claim 8, wherein the inorganic material comprises an alignment layer.

16. The method of claim 15, wherein the inorganic material comprises silicon oxide.

17. The method of claim 16, wherein a height of the organic pattern is higher than a thickness of the inorganic material by more than about 1000 times.

18. A method of manufacturing a display device, the method comprising:
    forming a connecting pad on a first substrate to apply a common voltage;
    forming a lower organic pattern on the connecting pad;
    depositing a lower alignment layer on the first substrate covering the lower organic pattern;
    removing the lower organic pattern partially exposing the common electrode;
    forming a common electrode on a second substrate and an upper alignment layer on the common electrode, wherein the upper alignment layer includes a contact hole partially exposing the common electrode;
    forming a sealant interposed between the lower alignment layer and the upper alignment layer;
    forming a connecting spacer between the connecting pad and the common electrode electrically connecting the connecting pad and the common electrode through the contact hole; and
    forming a liquid crystal layer between the lower alignment layer and the upper alignment layer, wherein the liquid crystal layer is sealed by the sealant.

19. The method of claim 18, wherein forming the connecting pad comprises:
    forming a TFT on a first substrate;
    forming a pixel electrode connected to the TFT;
    forming a transmission line to transmit a driving signal to the TFT, and a transmission pad connected to a terminal portion of the transmission line.

* * * * *